United States Patent [19]

Gaudenzi et al.

[11] Patent Number: 4,682,056
[45] Date of Patent: Jul. 21, 1987

[54] SWITCHING CIRCUIT HAVING LOW SPEED/POWER PRODUCT

[75] Inventors: Gene J. Gaudenzi, Purdys; Dennis C. Reedy, Stormville, both of N.Y.

[73] Assignee: International Business Machines Corporation, Armonk, N.Y.

[21] Appl. No.: 787,949

[22] Filed: Oct. 16, 1985

[51] Int. Cl.[4] .................. H03K 19/01; H03K 19/088; H03K 17/04; H03K 17/60

[52] U.S. Cl. .................... 307/456; 307/443; 307/270; 307/246

[58] Field of Search ............ 307/454, 443, 456, 457, 307/458, 466, 467, 475, 254, 270, 280, 300, 355, 246

[56] References Cited

U.S. PATENT DOCUMENTS

| | | | |
|---|---|---|---|
| 3,183,370 | 5/1965 | Trampel | 307/454 |
| 3,518,449 | 6/1970 | Chung | 307/454 |
| 3,699,355 | 10/1972 | Madrazo et al. | 307/456 |
| 4,092,551 | 5/1978 | Howard et al. | 307/254 |
| 4,237,388 | 12/1980 | Nokubo et al. | 307/454 |
| 4,321,490 | 3/1982 | Bechdolt | 307/456 |
| 4,394,588 | 7/1983 | Gaudenzi | 307/443 |
| 4,409,498 | 10/1983 | Dorler et al. | 307/475 |
| 4,504,744 | 3/1985 | Balakrisknan | 307/458 |
| 4,521,699 | 6/1985 | Wilson | 307/456 |
| 4,521,700 | 6/1985 | Blumberg et al. | 307/456 |
| 4,531,607 | 7/1985 | Banker et al. | 307/454 |
| 4,539,493 | 9/1985 | Varadajan | 307/300 |
| 4,605,864 | 8/1986 | Varadajan et al. | 307/300 |
| 4,605,870 | 8/1986 | Dansky et al. | 307/443 |

OTHER PUBLICATIONS

Dansky, Norsworthy, "Active Pull-Down Circuit for Current Control Gate", IBM Technical Disclosure Bulletin, vol. 24, No. 11A, Apr. 1982.
Michael D'Agostino, "Reactive Emitter Follower Logic Gate", RCA, Sep. 25, 1968.
S. K. Wiedmann, "TTL Circuit for Driving Heavy Load", IBM Technical Disclosure Bulletin, vol. 14, No. 5, Oct. 1971.
F. C. Wernicke, "Output Circuit for Fast Switching of Highly Capacitive Loads", IBM Technical Disclosure Bulletin, vol. 17, No. 8, Jan. 1975.
J. L. Walsh, "Binary Switching Circuits", vol. 14, No. 1, Jun. 1971.
J. B. Gillet, "Low Impedance Switching Circuit", IBM Technical, vol. 7, No. 6, Nov. 1964.

Primary Examiner—Stanley D. Miller
Assistant Examiner—Tai V. Duong
Attorney, Agent, or Firm—Wesley DeBruin

[57] ABSTRACT

The logic circuit disclosed exhibits push-pull output characteristic by employing a saturated feedback technique. This approach allows for emitter follower like up level drive and transient low impedance down level drive. The disclosed saturated feedback technique improves capacitive drive capability, reduces both load and circuit delay and reduces circuit power dissipation.

8 Claims, 5 Drawing Figures

SWITCHING CIRCUIT HAVING LOW SPEED/POWER PRODUCT

BACKGROUND OF THE INVENTION AND PRIOR ART

This invention relates to logic circuits and more particularly to transistor switching circuits having low speed/power product.

In the development of data processing equipment, extensive effort is being directed to integrated circuits having improved speed capabilities and speed/power factor.

In particular, as the logic circuit density and chip size increases for VLSI technologies, the requirement exists for logic circuits having the capability to drive high capacitance on chip loads at acceptable speed/power factors.

Prior art bipolar logic circuits such as DTL, TTL and ECL must operate at high power levels if low delay is required at high load capacitance. This relationship is due to the fact that active drive is available for only one output transition, while the other transition depends on the time constant of the output load resistance and capacitive load.

A technique to achieve good capacitive drive is to incorporate a push-pull circuit in the output. The push-pull circuit is well known to the art and is used extensively in off chip drivers and also in complementary NPN/PNP bipolar circuits. The logic circuit in accordance with the invention exhibits push-pull output characteristic by employing saturated feedback technique. This approach allows for emitter follower like up level drive and transient low impedance down level drive. The saturated feedback technique improves capacitive drive capability, reduces both load and circuit delay and reduces circuit power dissipation.

As with other circuits containing push-pull outputs, the logical dot function is avoided to eliminate a circuit contention problem.

There is a very sizeable number of logic circuits known to the art. It is to be appreciated with reference to the subject invention, that, the following art is not submitted to be the only prior art, the best prior art, or the most pertinent prior art.

BACKGROUND ART

U.S. Pat. Nos.

3,183,370 entitled "Transistor Logic In Circuits Operable Through Feedback Circuitry In Nonsaturating Manner" granted May 11, 1965 to K. M. Trampel 3,518,449 entitled "Integrated Logic Network" granted June 30, 1970 to D. H. Chung 3,699,355 entitled "Gate Circuit" granted Oct. 17, 1972 to C. F. Madrazo et al 4,237,388 entitled "Inverter Circuit" granted Dec. 2, 1980 to J. Nokubo et al 4,321,490 entitled "Transistor Logic Output For Reduced Power Consumption And Increased Speed During Low To High Transition" granted Mar. 23, 1982 to R. W. Bechdolt

SUMMARY OF THE INVENTION

VLSI logic circuits are often required to drive high output load capacitance which is comprised of the capacitance due to circuit fan out and also the capacitance of the interconnection metalization which can be substantial. A logic circuit capable of driving high on chip capacitance at reduced speed power product is disclosed. This desirable circuit feature is accomplished by optimizing the logic signal swing (approx. 600 mV) and providing active drive for both charging and discharging the load capacitance. By utilization of an output feedback path containing a saturated transistor, circuit rising and falling delays are enhanced and power dissipation is reduced.

The primary object of the invention is to provide an improved logic circuit.

A further primary object of the invention is to provide a logic circuit having a low speed/power product.

A still further primary object of the invention is to provide a logic circuit having enhanced ability to drive a highly capacitive load.

A still further object of the invention is to provide a logic circuit for driving a highly capacitive load where said logic circuit has an emitter follower like up level drive and transient low impedance down level drive.

These and other features and advantages of the invention will be apparent from the following more particular description of the preferred embodiment of the invention as illustrated in the accompanying drawings.

BRIEF DESCRIPTION OF THE DRAWING

FIG. 2 also discloses load current path for discharging the load capacitance (CL).

FIG. 4 also discloses the corresponding output waveform illustrating the threshold (0.85 V) of the next logic circuit when the input voltage changes from a logical 1 to 0.

DESCRIPTION OF THE PREFERRED EMBODIMENT

Figure 1:
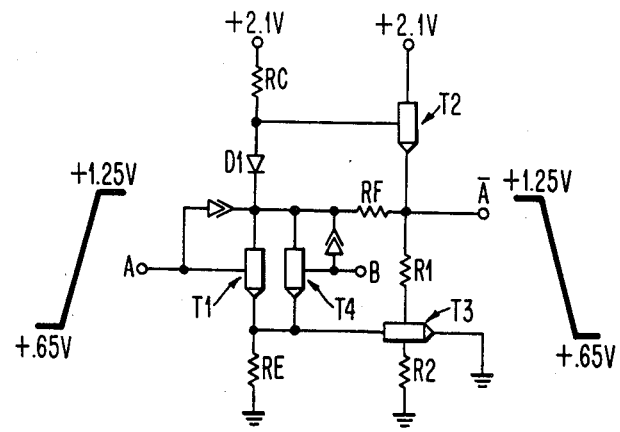
FIG. 1, in accordance with the invention, discloses the saturated feedback logic circuit and the input and output steady state signal characteristics.

The internal logic gate illustrated in FIG. 1 is designed as an inverting push pull type with speed depending on the load capacitance. Power dissipation is preserved due to the changing emitter impedance of the input device as the output voltage changes.

The inclusion of T3, R1 and R2 reduces the emitter load of transistor T1 during the time period $\overline{A}$ is at the 1 level and transversing to the zero level. This results in very low impedance from $\overline{A}$ to ground when A rises to the 1 level causing $\overline{A}$ to fall very fast. Once the 0 level is at $\overline{A}$, T3 must turn off therefore the emitter load of T1 changes to RE (approximately 750 ohms) and preserves the power dissipation. Due to the low impedance exhibited by the circuit output, excellent capacitive load driving capability is realized.

Circuit Operation

Discussion of circuit operation is limited to input A and assumes input B is at +0.65 V. Assume input A (FIG. 1) is at a logical 0 (+0.65 V), T1 cannot conduct causing D1, RF and T2 to conduct, therefore $\overline{A}$ is at the logical 1 level (+1.25 V). With $\overline{A}$ up, resistor divider R1 and R2 is chosen to cause T3 to conduct, its low output impedance (T3 is operated in saturation) in parallel with RE results in total emitter load to T1 of:

$$RE^\triangledown \approx 11.03 Kr \approx 30 \text{ ohms}$$

As input A rises thru a threshold of approximately +0.85 V, T1 begins to conduct a current in the range of 1 to 2 ma depending on the load capacitance. The input and output waveforms and circuit current paths are illustrated in FIG. 2.

Figure 2:
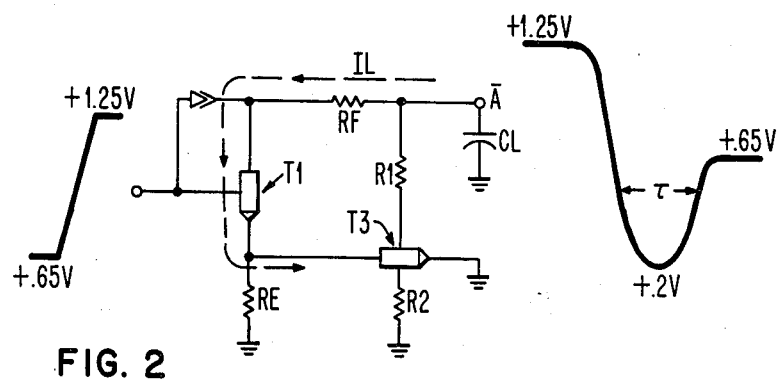
FIG. 2 discloses the rising input and falling output waveforms and the equivalent circuit of FIG. 1.
Figure 3:
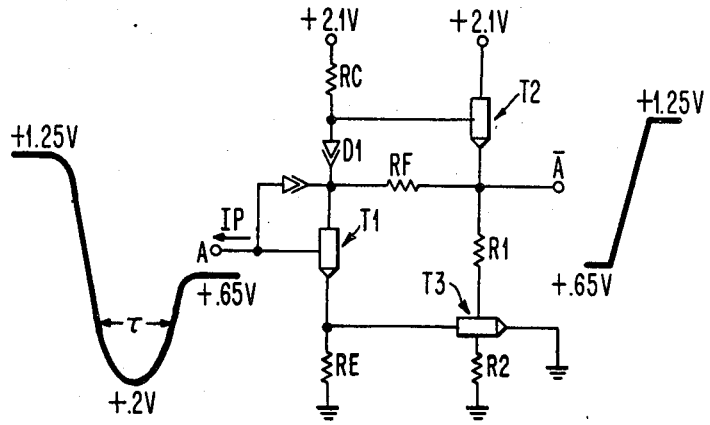
FIG. 3 discloses the falling input waveform and input current (IP) discharge, enhanced by input undershoot of duration $\tau$, and the corresponding output waveform.

Inspecting FIG. 2 we see the output voltage has a transient excursion of approximately 1.0 volt. This ΔV is determined by the path consisting of the voltage drop across RF, the VCE of T1 and the VCE of T3 (saturated). This is a desirable condition which enhances the speed of the next internal gate as illustrated in FIG. 3. The transient undershoot of 0.45 V below the +0.65 V level for τ ns causes the charge to be pulled out of the base of T1 (next internal gate load) resulting in its rapid turn off. The time period τ is easily controlled by selecting the level of saturation for T3 via R1/R2 design and/or the T3 base-collector area and/or doping concentration.

As previously stated, by this design technique, very fast output down going delays are achieved as a result of saturated feedback (T3). It should also be noted that due to the saturated feedback the circuit input threshold voltage is effected. For a logical input level (0.65 V) T3 is saturated and the input voltage only has to rise approximately 200 mv (0.85 V) to switch T1. This factor also enhances the rising input to falling output circuit delay.

Figure 4:
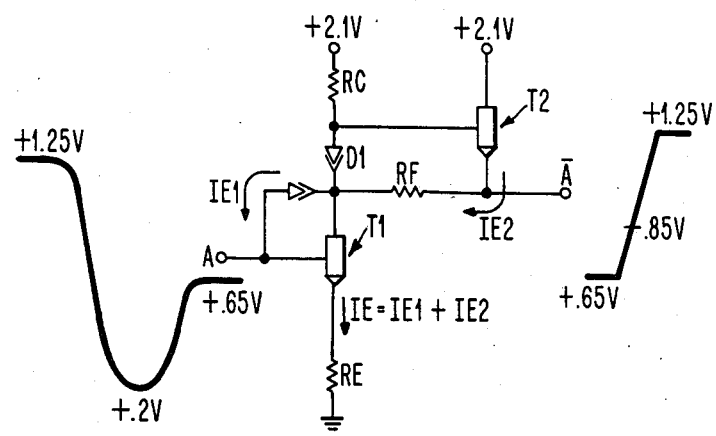
FIG. 4 discloses the equivalent circuit of FIG. 1 and DC current flow for Vin = 1.25 V.
Figure 5:
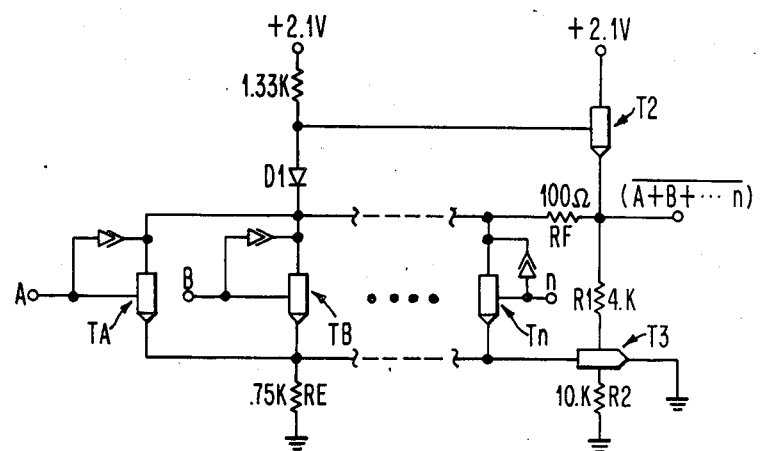
FIG. 5 discloses a multi-input version of the saturated feedback logic circuit in accordance with the invention.

Consider input A is now at approximately +1.25 V and output $\overline{A}$ is down at approximately +0.65 V, T1 is conducting such that RE is chosen to conduct a current level to support the conduction of both D1 and T2 as illustrated in FIG. 4.

Since D1 and T2 are designed to conduct in the steady state (output down) the junction capacitances of D1 and T2 are essentially precharged. When input A falls resulting in T1 turning off (very fast), D1 and T2 can rapidly supply the current required to switch the output to a logical 1 level. As previously stated, due to the saturated feedback technique, output $\overline{A}$ only has to rise to approximately 0.85 V before the threshold of the next stage is achieved which enhances circuit performance.

Inspecting the circuit in FIG. 1, chip active area may be preserved by the integration of D1 and T1 within the same collector bed. Resistors R1 and R2 may be ion implant type, RC and RE can be P-type and the feedback resistor RF (100Ω) could be an extension of the collector bed of D1 and T1.

While the invention has been particularly described with reference to the preferred embodiment, it will be understood by those skilled in the art that the foregoing and other changes and details may be made therein without departing from the spirit and scope of the invention.

What is claimed is:

1. An inverter circuit, said inverter circuit comprising:
   first, second and third transistors, said first, second and third transistors each having an emitter, base and collector, said emitter of said first transistor connected to said collector of said third transistor, said collector of said second transistor connected a first source of potential, and said emitter of said third transistor connected to a second source of potential;
   an input terminal for receiving a binary input A, said input terminal connected to said base of said first transistor;
   a first resistor, said first resistor connected between said emitter of said second transistor and said base of said third transistor;
   a second resistor, said second resistor connected between said base of third transistor and said second source of potential;
   a third resistor, said third resistor connected between said emitter of said first transistor and said second source of potential;
   a fourth resistor, said fourth resistor connected between said collector of said first transistor and said emitter of said second transistor;
   a fifth resistor, said fifth resistor connected between said base of said second transistor and said first source of potential;
   a diode, said diode connected between said base of said second transistor and said collector of said first transistor; and
   an output terminal for providing the binary output $\overline{A}$, said output terminal connected to said emitter of said second transistor.

2. An inverter circuit, as recited in claim 1, wherein the potential difference between said potential of said first source of potential and the potential of said second source of potential is in the order of 2.1 volts.

3. An inverter circuit, as recited in claim 1 or 2, wherein said first resistor has a resistance in the order of 4,000 ohms, said second resistor has a resistance in the order of 10,000 ohms, said third resistor has a resistance in the order of 750 ohms, said fourth resistor has a resistance in the order of 100 ohms, and said fifth resistor has a resistance in the order of 1330 ohms.

4. A logical binary circuit, said logical binary circuit providing the logical binary output $(\overline{A+B+\ldots N})$ in response to binary inputs A, B through N, where N is a positive integer greater than two and less than seven, said logical binary circuit comprising:
   first, second through N transistors, each of said first, second through N transistors having an emitter, base and collector;
   first, second through N input terminals, said first, second through N input terminals respectively receiving a binary input A, B through N, and each of said first, second through N input terminals respectively connected to said bases of said first, second through Nth transistors;
   first connection means connecting in common the collectors of said first, second through Nth transistors;
   second connection means connecting in common the emitters of said first, second through Nth transistors;
   an N+1 transistor and an N+2 transistor, said N+1 transistor and said N+2 transistor each having an emitter, base and collector, said collector of said N+1 transistor connected to a first source of potential, and said emitter of said N+2 transistor connected to a second source of potential;
   a first resistor, said first resistor connected between said emitter of said N+1 transistor and said base of said N+2 transistor;

a second resistor, said second resistor connected between said base of said N+2 transistor and said second source of potential;

a third resistor, said third resistor connected between said second connection means and said second source of potential;

a fourth resistor, said fourth resistor connected between said first connection means and said emitter of said N+1 transistor;

a fifth resistor, said fifth connected between said base of said N+1 transistor and said first source of potential;

a diode, said diode connected between said first connection means and said base of said N+1 transistor; and, an output terminal, said output terminal connected to the emitter of said N+1 transistor and providing the logical binary output ($\overline{A+B+\ldots}$)

5. A logical binary circuit, as recited in claim 4, wherein the magnitude of the resistance value of the first (R1), second (R2), third (R3), fourth (R4) and fifth (R5) resistors have the following relationship one to another

R4<R3<R5<R1<R2.

6. A logical binary circuit as recited in claim 5, wherein the potential difference between said first and second sources of potential is approximately 2.1 volts.

7. A logical binary circuit, as recited in claim 6, wherein the magnitude of the resistance values of R1, R2, R3, R4 and R5 are respectively approximately as follows:

R1=4000 ohms, R2=10,000 ohms, R3=750 ohms, R4=100 ohms and R5=1,330 ohms.

8. A logical binary circuit having a low speed/power product for driving a highly capacitive load, said logical binary circuit comprising:

at least one input terminal;

an output terminal;

first active circuit means for charging said highly capacitive load from a first potential to a second potential in response to a first binary input impressed on said at least one input terminal, where the absolute magnitude of said second potential is approximately twice the voltage magnitude of said first potential; and second active circuit means interconnected with said first circuit means, said second circuit means discharging said highly capacitive load from said second potential to said first potential in response to a second logical binary input impressed on said at least one input terminal;

said first and second active circuit means interconnected between said at least one input terminal and said output terminal; and, said logical binary circuit being further characterized in that a portion of said first active circuit means for charging said highly capacitive load is also employed in said second active circuit means for discharging said highly capacitive load and wherein said portion of said first active circuit means employed in both charging and discharging said highly capacitive load is at least one input transistor directly connected to said at least one input terminal.

* * * * *